(12) United States Patent
Cobb et al.

(10) Patent No.: US 8,653,810 B2
(45) Date of Patent: Feb. 18, 2014

(54) FLEXIBLE MAGNETOSTRICTIVE SENSOR

(75) Inventors: Adam C. Cobb, San Antonio, TX (US);
Jonathan D. Bartlett, San Antonio, TX (US); Charles E. Duffer, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 297 days.

(21) Appl. No.: 13/236,062

(22) Filed: Sep. 19, 2011

(65) Prior Publication Data

US 2013/0069639 A1    Mar. 21, 2013

(51) Int. Cl.
G01R 33/18    (2006.01)

(52) U.S. Cl.
USPC ............................. 324/209; 324/288; 324/238

(58) Field of Classification Search
USPC .......................................... 324/209, 228, 238
See application file for complete search history.

(56) References Cited

U.S. PATENT DOCUMENTS

| | | |
|---|---|---|
| 4,497,209 A | 2/1985 | Kwun et al. |
| 4,711,120 A | 12/1987 | Kwun et al. |
| 4,979,125 A | 12/1990 | Kwun et al. |
| 5,180,969 A | 1/1993 | Kwun et al. |
| 5,456,113 A | 10/1995 | Kwun et al. |
| 5,457,994 A | 10/1995 | Kwun et al. |
| 5,581,037 A | 12/1996 | Kwun et al. |
| 5,747,696 A | 5/1998 | Kwun et al. |
| 5,767,766 A | 6/1998 | Kwun |
| 5,821,430 A | 10/1998 | Kwun et al. |
| 5,970,434 A | 10/1999 | Brophy et al. |
| 6,000,288 A | 12/1999 | Kwum et al. |
| 6,134,947 A | 10/2000 | Kwun |
| 6,201,391 B1 | 3/2001 | Burkhardt et al. |
| 6,205,859 B1 | 3/2001 | Kwun et al. |
| 6,212,944 B1 | 4/2001 | Kwun et al. |
| 6,294,912 B1 | 9/2001 | Kwun |
| 6,295,677 B1 | 10/2001 | Kwunm et al. |
| 6,373,245 B1 | 4/2002 | Kwun et al. |
| 6,396,262 B2 | 5/2002 | Light et al. |
| 6,404,189 B2 | 6/2002 | Kwun et al. |
| 6,424,150 B2 | 7/2002 | Kwun et al. |

(Continued)

OTHER PUBLICATIONS

Kwun, et al, "The magnetostrictive sensor technology for long range guided wave testing and monitoring of structures," Mat. Eval. 61 (2003) 80-84.

(Continued)

*Primary Examiner* — Reena Aurora
(74) *Attorney, Agent, or Firm* — Grossman, Tucker et al

(57) ABSTRACT

A flexible printed circuit board (PCB) magnetostrictive (MS) sensor comprising a first direct current (DC) bias PCB layer comprising a first plurality of conductive traces, a first alternating current (AC) PCB layer disposed on the first DC bias PCB layer, the first AC PCB layer comprising a first AC coil, a pocket PCB layer disposed on the first AC PCB layer, the pocket PCB layer to receive a strip of MS material, a second AC PCB layer disposed on the pocket PCB layer, the second AC PCB layer comprising a second AC coil, and a second DC bias PCB layer disposed on the second AC PCB layer, the second DC bias PCB layer comprising a second plurality of conductive traces. The traces from the first plurality of conductive traces are electrically coupled to traces from the second plurality of conductive traces.

28 Claims, 6 Drawing Sheets

(56) References Cited

U.S. PATENT DOCUMENTS

| | | |
|---|---|---|
| 6,429,650 B1 | 8/2002 | Kwun et al. |
| 6,624,628 B1 | 9/2003 | Kwun et al. |
| 6,779,409 B1 | 8/2004 | Kwun et al. |
| 6,815,948 B1 | 11/2004 | Kwun et al. |
| 6,917,196 B2 | 7/2005 | Kwun et al. |
| 6,925,881 B1 | 8/2005 | Kwun et al. |
| 6,968,727 B2 | 11/2005 | Kwun et al. |
| 7,019,520 B2 | 3/2006 | Kwun et al. |
| 7,131,339 B2 | 11/2006 | Kwun et al. |
| 7,573,261 B1 | 8/2009 | Vinogradov |

OTHER PUBLICATIONS

Joule, "On the effects of magnetism upon the dimension;; of iron and steel bars," Philosophical Magazine 3 (30) (1847) 76.

Villari, "Change of magnetization by tension and by electric current," Annalen der Physik und Chemie/Leipzig 126 (1865) 87-122.

Thompson, "Physical principles of measurements with EMAT transducers," Physical Acoustics, XIX (1990) 157-200.

Hirao, et al., "EMATS for science and industry: noncontacting ultrasonic measurements," Kluwer Academic Publishers, 2003.

Maxfield, et al., "The design and use of electromagnetic acoustic wave transducers (EMATs)," Mat. Eval. 41, (1983) 1399-1408.

FLEXIBLE MAGNETOSTRICTIVE SENSOR

FIELD OF INVENTION

The present disclosure relates to magnetostrictive (MS) sensors, and in particular a flexible MS sensor implemented on a printed circuit board (PCB).

BACKGROUND

Magnetostrictive sensing technology is a practical tool for the generation and reception of physical elastic guided waves in many common engineering structures. For wave generation, the approach relies on the MS (or Joule) effect which is the manifestation of small changes in the physical dimensions of ferromagnetic materials caused by an externally applied magnetic field. For receiving elastic waves, it relies on the inverse MS (or Villari) effect which is a change in the magnetic induction of a ferromagnetic material caused by a mechanical stress or strain. Since the technology exploits the magnetostriction of materials, it is known as MS sensing.

Early applications of MS sensing relied on the ferromagnetic properties of the material to be inspected which limited its use. Later improvements employed a thin metallic strip of highly MS material which was bonded to the surface of the structure, allowing inspection of nonferrous and nonmetallic objects. These later MS sensing devices continued to suffer from a number of drawbacks, however. They were of fixed size and rigid thus limiting their potential deployment applications or requiring custom manufacture to specific sizes and situations. Additionally, the construction of the sensor is manually intensive requiring hand wrapping of the wire windings. The process involves a skilled technician through all construction steps following precise procedures to limit variability between sensors. Moreover, once the sensor is completed, it is specific to the final sensor profile. For example, a sensor built for a 12 inch diameter pipe cannot be used on a different diameter pipe or as a plate probe.

What is needed, therefore, is an improved manufacturing process using innovative circuit printing techniques that can produce an MS sensor design that is flexible enough to be applied to many different structure geometries.

SUMMARY

The present disclosure describes an MS sensor this is implemented in a flexible PCB configuration that is relatively easier to manufacture than traditional MS sensor designs and offers improved reliability and greater application deployment possibilities. The various components of the MS sensor comprising alternating current (AC) coils, a direct current (DC) bias coil and an MS material strip are incorporated in layers of the PCB along with isolating and protective layers. The flexibility of the PCB allows it to conform to a variety of structure geometries.

In some embodiments, individual PCB-based MS sensors are concatenated to form a larger meta-circuit MS sensor which may be deployed, for example, to circumferentially encompass relatively large pipe structures. The resulting sensor may be sized to an appropriate length by using as many sensor segments as needed to suit a particular application.

In some embodiments, the bias coil may be energized with a voltage pulse. The voltage pulse may be of sufficient duration to provide the magnetic bias when the sensor is in operation, allowing for higher magnetic field strengths, and thus increased wave amplitude and sensor performance, compared with a steady state bias voltage source.

In some embodiments, the orientation of the AC field and the DC bias field may be interchanged or swapped, while maintaining orthogonality between the two fields.

BRIEF DESCRIPTION OF DRAWINGS

The above-mentioned and other features of this disclosure, and the manner of attaining them, will become more apparent and better understood by reference to the following description of embodiments described herein taken in conjunction with the accompanying drawings, wherein.

DETAILED DESCRIPTION

Figure 1:
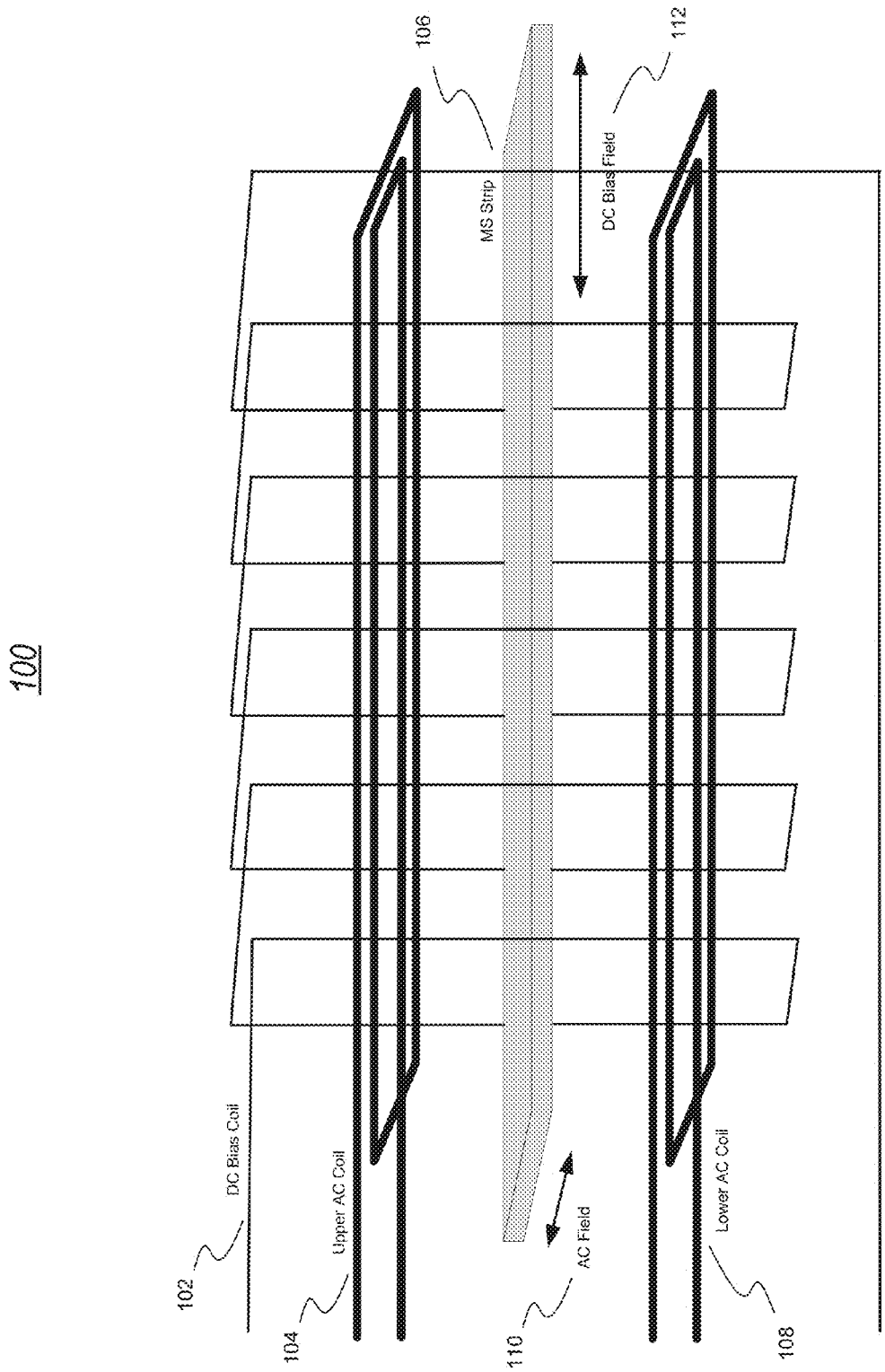
FIG. 1 is a perspective view of an exemplary embodiment of an MS sensor according to the present disclosure.

It may be appreciated that the present disclosure is not limited in its application to the details of construction and the arrangement of components set forth in the following description or illustrated in the drawings. The invention(s) herein may be capable of other embodiments and of being practiced or being carried out in various ways. Also, it may be appreciated that the phraseology and terminology used herein is for the purpose of description and should not be regarded as limiting as such may be understood by one of skill in the art.

Throughout the present description, like reference characters may indicate like structure throughout the several views, and such structure need not be separately discussed. Furthermore, any particular feature(s) of a particular exemplary embodiment may be equally applied to any other exemplary embodiment(s) of this specification as suitable. In other words, features between the various exemplary embodiments described herein are interchangeable, and not exclusive.

The present application relates to magnetostrictive sensing (MS) and, in particular, to the implementation and use of MS sensors on flexible printed circuit boards (PCBs). The use of PCBs to house the sensor components simplifies the manufacture and deployment of the MS sensors and increases their reliability as will be described below. The flexibility of the PCB allows it to conform and sense a variety of structure geometries of objects to be inspected. The flexibility herein may therefore be understood as the ability of the MS sensor on a flexible PCB to, e.g., bend along its long axis such that it conforms to a radius of curvature (Rc) down to and including 0.02 feet. Furthermore, the MS sensor on a flexible PCB can bend along its long axis in either direction, allowing the sensor to conform to both concave and convex surfaces. The flexibility may also be understood as the ability of the MS sensor on a flexible PCB to, e.g., conform to a flat structure (an Rc of infinity). More specifically, the flexibility herein may be such that the PCB herein and/or any one of its individual layers may be constructed such that the PCB or a layer therein may bend along its long axis and conform to an Rc of 0.02 feet or more while providing magnetostrictive sensing performance.

MS sensors can generate changes in the physical dimensions of a structure under inspection through the application of a time varying magnetic field. These physical changes generate elastic waves in the structure, which in turn propagate away from the MS sensor. The same MS sensor, another MS sensor or another elastic wave sensor may then be used to detect the travelling elastic wave after a time delay. The detected travelling wave can be analyzed to detect damage, such as a fatigue crack, or reveal changes in the mechanical properties of the structure such as, for example, variations in composition or density. The time varying magnetic fields are generated by AC currents flowing through conductive coils in proximity to an MS material. The presence of an additional orthogonal DC magnetic field, generated by a DC current flowing through another conductive coil, enhances the magnitude of the generated time varying magnetic field.

Referring now to FIG. 1, there is shown a perspective view 100 of an exemplary embodiment of an MS sensor according to the present disclosure. An MS sensor 100 may comprise several layers. A strip of MS material 106 is located at the core of the sensor in the central layer. In some embodiments, the MS strip 106 may be fabricated from nickel, alloys of iron and cobalt, and alloys of Tb, Dy and Fe, such as Terfenol-D ($Tb_xDy_{1-x}Fe_2$, x~0.3) or other suitable materials and may be less than 0.010 inches in thickness with one edge of the strip longer than the other. The MS strip 106 allows MS-based inspection of structures made from nonferrous or nonmetallic materials, such as composites and plastics, and serves to amplify the elastic wave generation thus reducing the operating power requirements of the sensor.

Above and below the MS strip 106 are an upper AC coil 104 and a lower AC coil 108, respectively. The AC coils 104, 108 shown in FIG. 1 have two loops for simplicity of illustration, but in practice many more loops may be used. The number of loops used may, for example, be in the range of 5-15. During sensor operation, an AC tone burst is delivered through the coils 104, 108 which generate an alternating magnetic field 110 in the MS strip 106 parallel to the short side of the MS strip 106. The strength of the applied AC signal may be directly related to the amplitude of the generated elastic wave. The line spacing between loops of the coils may be directly related to the wavelength of the elastic wave to be generated. The AC coils may be copper coils or another suitable conductive material.

A DC bias coil 102 is wound around the upper AC coil 104, MS strip 106 and lower AC coil 108. Application of a DC current to the DC bias coil 102 generates a static or DC bias magnetic field 112 oriented along the long axis of the MS strip 106 (or perpendicular to the AC magnetic field 110). The DC bias field 112 increases the strength of the generated elastic wave. Although only six loops of the DC bias coil winding are shown in FIG. 1 for simplicity, in practice many more loops may be used. The number of loops used may, for example, be in the range of 10-100, depending on sensor length. The DC bias coil may be a copper coil or another suitable conductive material.

Figure 2:
FIG. 2 is a cross sectional view of an exemplary embodiment of an MS sensor according to the present disclosure.

Referring now to FIG. 2, there is shown a cross sectional view 200 of an exemplary embodiment of an MS sensor according to the present disclosure. The component elements of an MS sensor that were described with reference to FIG. 1 above are now illustrated as a cross sectional view of an implementation of those elements in layers of a flexible PCB 200. The top layer is a flexible cover material 202, which protects the circuit from the environment. The next layer is the DC bias trace layer 204, which contains electrical traces that form the upper part of the DC bias coil 102, as will be explained in greater detail below. The next layer is a flexible core layer 206 that isolates the DC bias trace layer 204 above from the AC trace layer 208 below. The next layer is the AC trace layer 208, which contains electrical traces that form the upper AC coil 104. The next layer is another flexible cover material layer 202. These five layers form an upper section of the flexible PCB 200 and may be manufactured as one sub-unit. Each layer may be created from a flexible polyimide tape-like material such as KAPTON™ or other suitable insulating material and bonded together to form the sub-unit.

With respect to polyimide film, it can be noted that such film is selected to contribute to the flexibility of the PCB sensor noted above. As noted, the film may be sourced from a polyimide, such as poly(4,4'-oxydiphenylene-pyromellitimide). The film may preferably have a thickness of 1 mil (25 μm)-5 mils (125 μm). The film may therefore be any suitable dielectric that has a folding endurance of 5000-285,000 cycles according to ASTM D-2176-89, and elongations of up to 82% (ASTM D-882-91)

A lower section of the flexible PCB 200 is similarly formed from five layers as described above. In particular, a top flexible cover material layer 202, an AC trace layer 208, a flexible core layer 206, a DC bias trace layer 204 and another flexible cover material 202. The upper and lower sections are then bonded together with bonding strips 210 that leave a cavity or pocket into which the MS strip 212 may subsequently be inserted and bonded. In some embodiments, the bonding may be accomplished with epoxy.

The electrical traces in the DC bias trace layers 204 of the upper and lower sections run parallel to the short axis of the flexible PCB 200 and form the upper and lower parts of the of the DC bias coil 102. Each trace of the upper DC bias layer is electrically connected to a corresponding trace of the lower DC bias layer. This connection may be made, for example, through vias that tunnel through the intervening layers or by other suitable methods. The electrically coupled upper and lower DC bias traces result in a continuous winding coil that wraps around both AC coils 208 and the MS strip 212.

Figure 3:
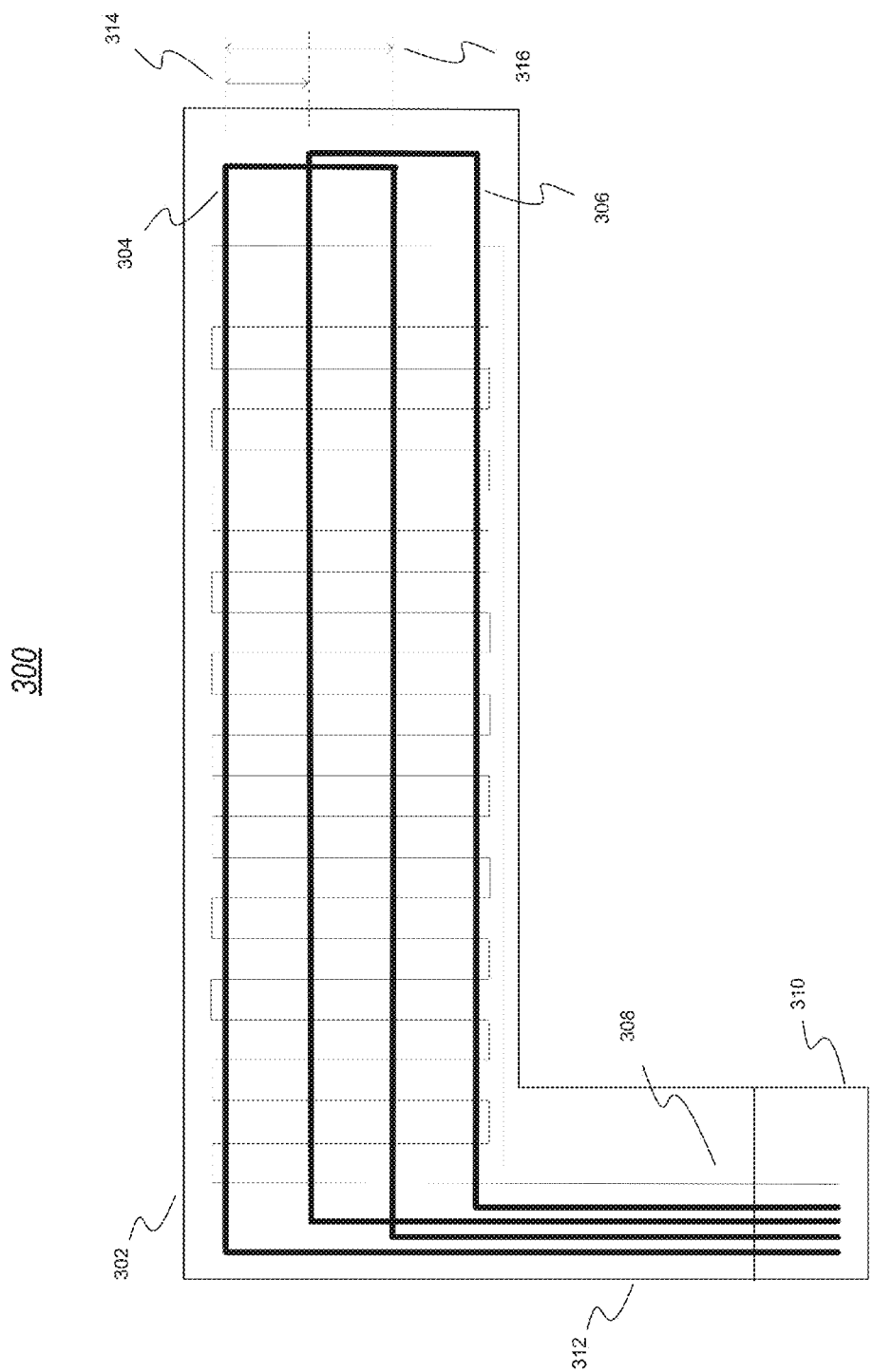
FIG. 3 is a top view of an exemplary embodiment of an MS sensor according to the present disclosure.

Referring now to FIG. 3, there is shown a top view 300 of an exemplary embodiment of an MS sensor according to the present disclosure. The MS sensor is embodied in a flexible PCB 302 with a long axis and a shorter extension 312 located on one edge of the circuit that terminates in a rigid section 310 to which electrical connectors may be attached. In this view, looking down through the layers of the PCB, there is shown the upper AC coil 304, the lower AC coil 306 and the DC bias coil 308. The upper AC coil 304 may be offset from the lower AC coil 306 by a distance 314 approximately equal to a quarter wavelength of the elastic wave to be generated. The spacing between the long edges of each coil 316 may be approximately equal to a half wavelength of the elastic wave to be generated. The two AC coils 304 and 306 may provide directional control of the generated guided waves by delaying the excitation of one coil relative to the other.

Figure 4:
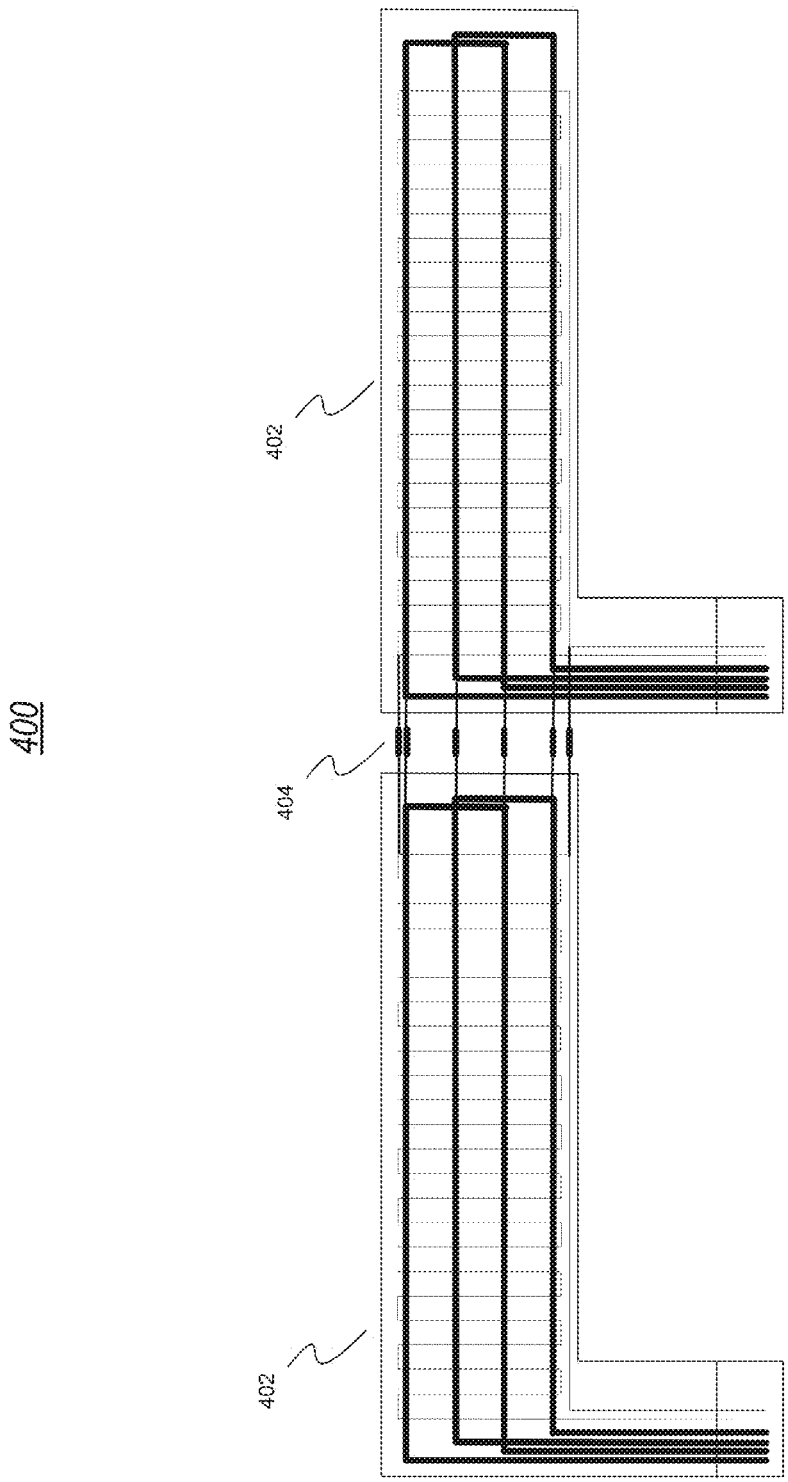
FIG. 4 is a top view of a configuration of multiple MS sensors in an exemplary embodiment according to the present disclosure.

Referring now to FIG. 4, there is shown a top view 400 of a configuration of multiple PCB based MS sensors in an exemplary embodiment according to the present disclosure. Any number of individual PCB based MS sensors 402 may be connected together, or concatenated, in a daisy chain arrangement through electrical and physical attachment points 404 along the short axis ends of the sensors 402. The electrical connections may be accomplished by populating surface mounted attachment points with zero ohm resistors. In some embodiments, a single MS strip of appropriate length can be inserted and bonded into the combined segments to simplify the manufacturing process.

The resulting single meta-circuit may be useful for deployment on large structures. In an alternative embodiment, the zero ohm resistors may be omitted and each individual sensor 402 can be operated independently resulting in a segmented array that may be useful for localizing the circumferential position of a damaged site in the structure under inspection.

Figure 5:
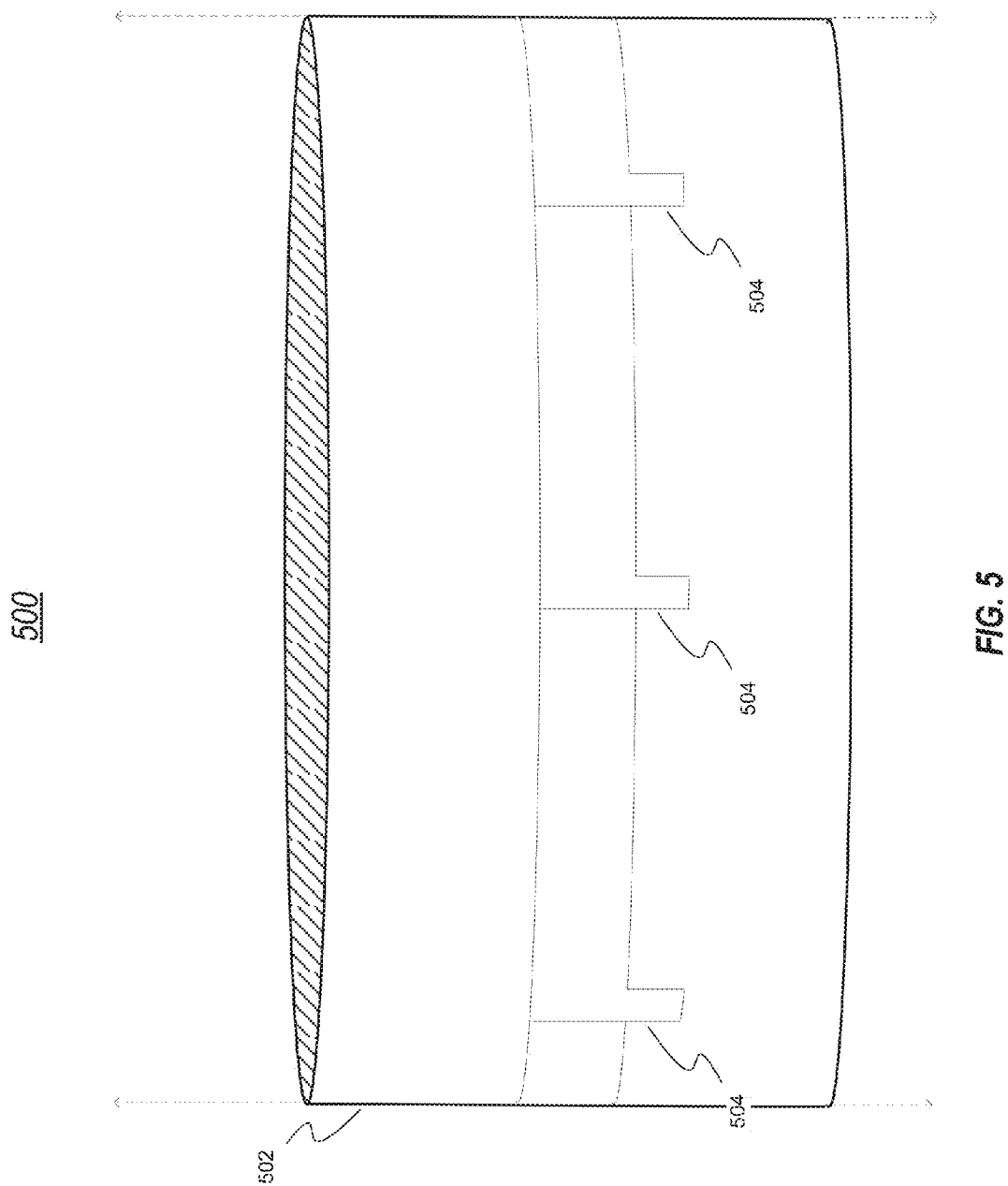
FIG. 5 is a perspective view of a configuration of multiple MS sensors deployed in an exemplary embodiment according to the present disclosure.

Referring now to FIG. 5, there is shown a perspective view 500 of a configuration of multiple MS sensors deployed in an exemplary embodiment according to the present disclosure. Multiple individual sensors 504 may be connected to form a single meta-circuit. Due to its length and flexibility, the resulting single meta-circuit may be deployed around the circumference of a relatively large pipe structure 502. Since pipe structures commonly have diameters that are integer multiples of an inch, it may be advantageous to fabricate individual sensors 504 of length approximately 3.14 (pi) inches so that N sensors fit a pipe of N inch diameter. In some embodiments, N may have a value herein in the range of 1 to 5 although larger values of N are also possible.

Figure 6:
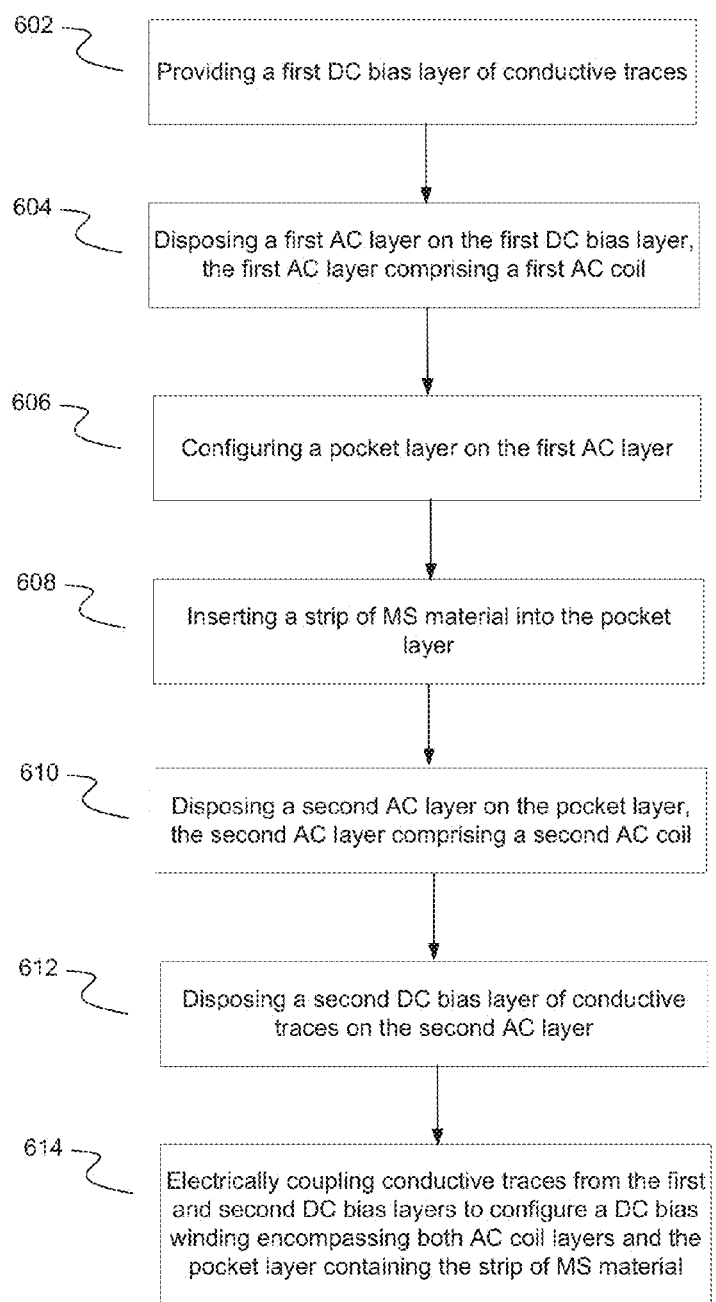
FIG. 6 illustrates a flowchart of a method consistent with an exemplary embodiment of an MS sensor according to the present disclosure.

Referring now to FIG. 6, there is shown a flowchart 600 of a method consistent with an exemplary embodiment of an MS sensor according to the present disclosure. The MS sensor is again implemented in a plurality of layers of a PCB having a long axis and a short axis orthogonal to the long axis. The PCB is flexible along the long axis. In some embodiments, the PCB long axis is an integer multiple of approximately Pi (3.14) inches. At operation 602, a first DC bias layer of conductive traces is provided. At operation 604, a first AC layer comprising a first AC coil is disposed on the first DC bias layer. At operation 606, a pocket layer is configured on the first AC layer. At operation 608, a strip of MS material is inserted into the pocket layer and may be bonded into place. As noted above, the MS material may be one of Nickel, Iron-Cobalt Alloy or alloys of Tb, Dy and Fe, such as Terfenol-D ($Tb_xDy_{1-x}Fe_2$, x~0.3). At operation 610, a second AC layer comprising a second AC coil is disposed on the pocket layer. At operation 612, a second DC bias layer of conductive traces is disposed on the second AC layer. At operation 614, conductive traces from the first and second DC bias layers are electrically coupled to configure a DC bias winding encompassing both AC coil layers and the pocket layer containing the strip of MS material.

In some embodiments, a flexible insulation layer may be disposed above and below each of said DC bias layers and AC layers to provide electrical isolation (electrical separation from other metallic structures or the environment) and/or environmental protection (protection from external reagents chemicals that may otherwise degrade the performance of the MS sensor).

In some embodiments, the first AC coil and said second AC coil have long axes parallel to the PCB long axis and have short axes parallel to the PCB short axis, while the DC bias winding has a long axis orthogonal to the PCB long axis and parallel to the PCB short axis. In an alternative embodiment, the orientation of the first and second AC coils relative to the orientation of the DC bias winding is reversed, with the AC coils having long axes parallel to the PCB short axis and the DC bias winding having a long axis parallel to the PCB long axis.

In some embodiments the DC bias current is a constant current delivered at a voltage that is limited to levels that will not damage the sensor due to resistive heat dissipation. In other embodiments the DC bias current may be delivered only in pulses. By limiting the time duration of the pulses (pulse width) to provide the magnetic bias when the sensor is in operation the pulse voltage may be safely increased. In some embodiments, pulse widths may be in the range of 1-5 milliseconds. In this manner, the increased voltage levels of the pulses may enable the generation of guided waves with increased amplitudes and improved sensor operation compared with a steady state bias voltage source.

The implementation of MS sensors on a PCB herein may therefore simplify their manufacture and reliability because it avoids the manual and labor intensive process of hand winding coils of wire, a process that may be relatively tedious, error-prone and requires the involvement of a skilled technician. Furthermore, it is relatively difficult, using manual processes, to limit variability in the resulting product from one unit to the next. In contrast, PCB manufacturing is an automated process using mass production technology capable of delivering precision products in a uniform manner at a reduced cost.

Additionally, as alluded to above, the flexibility of the PCB implementation herein now allows the MS sensor to conform to a wide variety of differing geometries. Thus, a single sensor can now be produced without prior knowledge of a specific final installation. The ability to form relatively longer sensors, by combining the individual sensor segments described herein, is also contemplated to further increase application and deployment possibilities.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A printed circuit board (PCB) magnetostrictive (MS) sensor comprising:
   a first direct current (DC) bias PCB layer comprising a first plurality of conductive traces;
   a first alternating current (AC) PCB layer disposed on said first DC bias PCB layer, said first AC PCB layer comprising a first AC coil;
   a pocket PCB layer disposed on said first AC PCB layer, said pocket PCB layer to receive a strip of MS material;
   a second AC PCB layer disposed on said pocket PCB layer, said second AC PCB layer comprising a second AC coil; and
   a second DC bias PCB layer disposed on said second AC PCB layer, said second DC bias PCB layer comprising a second plurality of conductive traces, wherein traces from said first plurality of conductive traces are electrically coupled to traces from said second plurality of conductive traces, such that said electrically coupled traces are configured as a DC bias winding that circumferentially encompasses said first AC coil, said strip of MS material and said second AC coil.

2. The sensor of claim 1, wherein said PCB has a long axis and a short axis, said PCB short axis orthogonal to said PCB long axis, and wherein said PCB is flexible along said PCB long axis.

3. The sensor of claim 2, wherein said first AC coil and said second AC coil have long axes parallel to said PCB long axis and have short axes parallel to said PCB short axis.

4. The sensor of claim 2, wherein said first AC coil and said second AC coil have long axes parallel to said PCB short axis and have short axes parallel to said PCB long axis.

5. The sensor of claim 2, wherein said DC bias winding has a long axis orthogonal to said PCB long axis and parallel to said PCB short axis.

6. The sensor of claim 2, wherein said DC bias winding has a long axis parallel to said PCB long axis and orthogonal to said PCB short axis.

7. The sensor of claim 2, wherein said PCB long axis is an integer multiple of Pi (3.14) inches.

8. The sensor of claim 2, further comprising physical and electrical attachment points along edges of said PCB short axis, enabling concatenation of a plurality of said sensors such that a composite sensor is provided, said composite sensor of length equal to an integer multiple of said PCB long axis.

9. The sensor of claim 8, wherein one or more of said electrical attachment points are disabled.

10. The sensor of claim 8, wherein said composite sensor is configured to circumferentially encompass a long axis of an object under test.

11. The sensor of claim 1 wherein said PCB is capable of bending along its long axis and conforming to a radius of curvature (Rc) of 0.02 feet or greater.

12. The sensor of claim 1, wherein said MS material is selected from the group consisting of Nickel, Iron-Cobalt Alloy and alloys of Tb, Dy and Fe.

13. The sensor of claim 1, further comprising a flexible insulation PCB layer disposed above and below each of said DC bias PCB layers and AC PCB layers, said flexible insulation PCB layer to provide electrical isolation and/or environmental protection.

14. The sensor of claim 1, wherein said DC bias winding is driven with electrical pulses.

15. A method for employing a printed circuit board (PCB) implemented sensor for magnetostrictive (MS) sensors sensing, comprising:
providing a first direct current (DC) bias PCB layer comprising a first plurality of conductive traces;
disposing a first alternating current (AC) PCB layer on said first DC bias PCB layer, said first AC PCB layer comprising a first AC coil;
configuring a pocket PCB layer on said first AC PCB layer;
inserting a strip of MS material into said pocket PCB layer;
disposing a second AC PCB layer on said pocket PCB layer, said second AC PCB layer comprising a second AC coil;
disposing a second DC bias PCB layer on said second AC PCB layer, said second DC bias PCB layer comprising a second plurality of conductive traces; and
electrically coupling traces from said first plurality of conductive traces to traces from said second plurality of conductive traces, such that said electrically coupled traces are configured as a DC bias winding that circumferentially encompasses said first AC coil, said strip of MS material and said second AC coil.

16. The method of claim 15, wherein said PCB has a long axis and a short axis, said PCB short axis orthogonal to said PCB long axis, and wherein said PCB is flexible along said PCB long axis.

17. The method of claim 16, wherein said first AC coil and said second AC coil have long axes parallel to said PCB long axis and have short axes parallel to said PCB short axis.

18. The method of claim 16, wherein said first AC coil and said second AC coil have long axes parallel to said PCB short axis and have short axes parallel to said PCB long axis.

19. The method of claim 16, wherein said DC bias winding has a long axis orthogonal to said PCB long axis and parallel to said PCB short axis.

20. The method of claim 16, wherein said DC bias winding has a long axis parallel to said PCB long axis and orthogonal to said PCB short axis.

21. The method of claim 16, wherein said PCB long axis is an integer multiple of Pi (3.14) inches.

22. The method of claim 16, further comprising providing physical and electrical attachment points along edges of said PCB short axis, enabling concatenation of a plurality of said PCB sensors such that a composite sensor is provided, said composite sensor of length equal to an integer multiple of said PCB long axis.

23. The method of claim 22, further comprising disabling one or more of said electrical attachment points.

24. The method of claim 22, further comprising configuring said composite sensor to circumferentially encompass a long axis of an object under test.

25. The method of claim 15 wherein said PCB is capable of bending along its long axis and conforming to a radius of curvature (Rc) of 0.02 feet or greater.

26. The method of claim 15, wherein said MS material is selected from the group consisting of Nickel, Iron-Cobalt Alloy and alloys of Tb, Dy and Fe.

27. The method of claim 15, further comprising disposing a flexible insulation PCB layer above and below each of said DC bias PCB layers and AC PCB layers, said flexible insulation PCB layer to provide electrical isolation and environmental protection.

28. The method of claim 15, further comprising driving said DC bias winding with electrical pulses.

* * * * *